(12) United States Patent
Swale (10) Patent No.: US 6,519,321 B2
(45) Date of Patent: Feb. 11, 2003

(54) 2ND LEVEL POWER FAULT TESTING APPARATUS FOR TESTING TELECOMMUNICATIONS EQUIPMENT

(75) Inventor: Gary L. Swale, Penngrove, CA (US)

(73) Assignee: Alcatel, Paris (FR)

( * ) Notice: Subject to any disclaimer, the term of this patent is extended or adjusted under 35 U.S.C. 154(b) by 200 days.

(21) Appl. No.: 09/753,885

(22) Filed: Jan. 3, 2001

(65) Prior Publication Data

US 2002/0106058 A1 Aug. 8, 2002

(51) Int. Cl.[7] ................................................. H04M 1/24
(52) U.S. Cl. ................... 379/26.01; 379/27.06; 379/29.05
(58) Field of Search ........................... 379/26.01, 27.05, 379/27.06, 29.03, 29.05, 412, 15.01; 324/508, 509

(56) References Cited

U.S. PATENT DOCUMENTS 4,785,373 A * 11/1988 Dash ........................... 361/235
4,825,458 A * 4/1989 Dash ........................... 324/111

OTHER PUBLICATIONS

"Electromagnetic Compatibility and Electrical Safety Lightning and AC Power Fault"; Section 4; 42 pages; GR–1089–CORE; Issued Dec. 2, 1997; Revision Feb. 1, 1999.

* cited by examiner

Primary Examiner—Curtis Kuntz
Assistant Examiner—Barry W Taylor
(74) Attorney, Agent, or Firm—Danamraj & Youst LLP; Richard A. Mysliwiec; V. Lawrence Sewell (57) ABSTRACT

A power fault testing apparatus for testing telecommunications interfaces to BellCore's $2^{nd}$ Level AC power fault standards. The apparatus is powered by a three-phase 480 VAC, 600 A power service. A plurality of transformers and load resistor banks are coupled to the power source in a network organized as a plurality of selectable and switchable power paths for interfacing to tip-and-ring interfaces or broadband coaxial cable interfaces of telecom equipment. Power relays are provided for interconnecting the transformers and load resistor banks in the network arrangement. Computer-controlled output relays are included for effectuating precise, repetitive time duration control of output power applied to the telecom interfaces under test.

21 Claims, 6 Drawing Sheets

$2^{ND}$ LEVEL POWER FAULT TESTING APPARATUS FOR TESTING TELECOMMUNICATIONS EQUIPMENT

CROSS-REFERENCE TO RELATED APPLICATION(S)

This application discloses subject matter related to the subject matter disclosed in the following commonly owned co-pending patent application(s): (i) "$1^{ST}$ Level Power Fault Testing Apparatus For Testing Telecommunications Equipment," filed Jan. 3, 2001, Ser. No.: 09/753,800, in the name(s) of: Gary L. Swale.

BACKGROUND OF THE INVENTION

1. Technical Field of the Invention

The present invention relates to testing equipment for telecommunications equipment. More particularly, and not by way of any limitation, the present invention is directed to an AC power fault machine capable of testing telecom line cards and broadband coaxial cable interfaces to known power fault immunity criteria.

2. Description of Related Art

Telecommunications (telecom) equipment deployed in today's networks is required to comply with various governmental and industry standards not only to ensure seamless interoperability which reduces the risk of service interruption resulting from third-party product failures, but also to address various product safety issues. Accordingly, equipment manufacturers test their products to telecom industry standards commonly known as BellCore specifications (also sometimes referred to as Telcordia specifications) which define an extensive list of electromagnetic compliance (EMC), product safety, and environmental requirements.

The BellCore specifications comprise two sets of testing standards, GR-1089-CORE and GR-63-CORE. The tests in GR-1089-CORE deal primarily with electrical phenomena, whereas the tests in GR-63-CORE are predominantly environmental in nature. While each set of standards is quite extensive, typically only a subset of the tests are required based on the type of equipment and its intended operating environment. Together, these two sets of standards specify the electrical and environmental requirements that networking hardware must meet in order to be located in a telco building, e.g., the telco's central office (CO).

Besides the testing requirements, which are determined by product type, BellCore has defined additional testing levels generally referred to in the telecom industry as Telcordia's Network Equipment Building Systems (NEBS) levels. The appropriate NEBS level for a particular equipment is determined, again, by its intended operating environment and specific requirements of the Regional Bell Operating Companies (RBOCs). Generally, a higher NEBS level indicates a more stringent testing specification.

NEBS testing verifies that telecom equipment can operate successfully under certain electrical and physical environmental stresses and not pose a safety hazard to personnel and users. These stresses and hazards include earthquakes, airborne contaminants, fire and smoke, electromagnetic interference (EMI), electrical safety, and grounding.

Requirements under the three NEBS levels may be summarized as follows: Level 1 includes: electrical safety; lighting and AC power fault ($2^{nd}$ level); bonding and grounding; emissions; and fire resistance; Level 2 includes: all of Level 1 in addition to—electrostatic discharge (ESD) under normal operation; emissions and immunity; lighting and AC power fault ($1^{st}$ level); ambient temperature and humidity (operating); earthquake Zone 2 and office vibration; and airborne contaminants (indoor level); Level 3 includes: all of Level 1 and Level 2 in addition to—ESD (installation and repair); open door emissions and immunity; ambient temperature and humidity (short-term); earthquake Zone 4; airborne contaminants (outdoor level); and transportation and handling. Each test within these three Levels is defined in either the GR-1089-CORE or GR-63-CORE documentation.

Testing of telecom interfaces, i.e., tip-and-ring (T and R) interfaces of the line cards utilized in telecom equipment and broadband coaxial cable interfaces, for lightning and AC power fault immunity in accordance with the above-referenced standards is necessary for several reasons. Power companies, Local Exchange Carriers (LECs) and broadband access providers often serve the same customers, and frequently employ joint-use facilities such as supporting structures or a common trench for their respective outside plant. Metallic conductors, such as cable or wire pairs serving telecom equipment may be exposed to electrical surges resulting from lightning and commercial power system disturbances. Despite the presence of protective devices in the telecommunications network that limit the effect of lightning and power surges, a portion of these disturbances can be impressed on the network equipment. Accordingly, under abnormal conditions, for instance, the power and telecommunications lines (including coax cables) may come into electrical contact. If the contact occurs to a primary power line, faults may be cleared quickly by the power system (5 seconds or less), and protectors (e.g., carbon blocks) can limit 60 Hz voltages appearing on the T or R conductors to maximum of approximately 600 VRMS with respect to ground. If the contact occurs to a secondary power line, the full secondary voltage with respect to ground (up to about 275 VRMS in some cases) may appear on the T and R conductors, which may persist indefinitely as the secondary fault may not be cleared by the power system.

Moreover, because electric power lines and telecom lines often occupy parallel routes as a result of a common right-of-way, the magnetic field produced by currents in a nearby power line, especially under abnormal conditions such as a phase-to-ground fault, may result in large voltages being induced into the telecom lines through electromagnetic coupling. The induced voltages appear longitudinally in the T and R conductors and may approach several hundred volts. Lower levels of induction may result from a high-impedance power fault such as a phase conductor falling to the earth. If the resulting unbalanced current is within the normal operating range of the power system, or if power system breakers or fuses do not operate, the fault may persist for an extended period of time.

Under the BellCore's GR-1089-CORE standard, the lightning surge and AC power fault immunity criteria include compliance with various tests such as short-circuit tests (tip to ring, tip to ground with ring open-circuited, ring to ground with tip open-circuited, tip and ring to ground simultaneously, et cetera) and several AC power fault tests. As set forth hereinabove, these criteria are separated into $1^{st}$ level and $2^{nd}$ level criteria. To comply with the $1^{st}$ level criteria, it is required that the telecom equipment under test (i.e., EUT) be undamaged and continue to operate properly after power stress is removed. To comply with the $2^{nd}$ level criteria, primary protectors are typically removed and high open-circuit voltages and high short-circuit currents are often applied for variable durations, ranging up to 15 to 30 minutes or so in some instances. The EUT may sustain damage, but it is required that the equipment not become a fire, fragmentation (that is, forceful ejection of fragments), or an electrical safety hazard.

While several lightning machines are available for conducting the lightning compliance tests required under the BellCore standards alluded to hereinabove, there is a paucity of appropriate AC power fault (PF) machines capable of sourcing power to telecom units under test for adequately conducting the AC power fault compliance tests, including the $2^{nd}$ Level tests. Further, the relatively few solutions extant today are beset with various shortcomings and drawbacks. First, the existing AC power fault machines are typically custom-designed to a large extent and, accordingly, incapable of accommodating various telecom equipment types and form factors. Additionally, these machines are quite expensive to manufacture owing at least in part to their custom design. In spite of the custom design, however, the existing PF machines are not capable of providing appropriate levels of test power safely to the EUT to conduct the whole range of $2^{nd}$ Level power failure tests as required under the relevant Sections of the GR-1089-CORE standard. Furthermore, although the conventional PF machines are fairly capacious because of the large size of the transformers typically required to provide adequate levels of test power, they are incapable of sourcing power to both two-wire T/R interfaces as well as broadband coax cable interfaces in the same physical plant.

SUMMARY OF THE INVENTION

Accordingly, the present invention advantageously provides a safe, versatile and single-platform power fault (PF) testing apparatus that is capable of testing both line cards' T/R interfaces (two-wire interfaces) as well as broadband coaxial cable interfaces to BellCore's $2^{nd}$ Level AC power fault standards. The apparatus is powered by a three-phase 480 VAC, 600 A shore power service. A plurality of transformers and load resistor banks are coupled to the power source in a network configuration that is organized as a plurality of selectable and switchable power paths for interfacing to T/R or broadband coaxial cable interfaces of the EUT disposed in a test chamber. Power relays are provided for interconnecting the transformers and load resistor banks in the network arrangement. Computer-controlled output relays are included for effectuating precise and repetitive time duration control of output power applied to the telecom interfaces under test. A remote control station is provided whereby test personnel may monitor and control all parameters of the PF apparatus.

In the presently preferred exemplary embodiment of the present invention, a motor-driven variable autotransformer unit is coupled to the shore power source through a power relay. The variable autotransformer unit is operable to provide a power output that is selectably switchable to a first load resistor bank by means of one or more power relays. A two-wire T/R interface of the EUT disposed is controllably powered by means of an output relay coupled to the first load resistor bank that is preferably provided as a collection of binary-coded resistance values in one or more branches. The branch resistance is variably selectable by remotely controlled relays.

A first fixed transformer is selectably coupled to the output of the variable autotransformer unit in a current boost configuration. The first fixed transformer is operable to provide selectably switchable power to a second load resistor bank, wherein the second load resistor bank interfaces to a coaxial cable interface via an output relay. One or more power relays interconnect the first fixed transformer to the second load resistor bank which is preferably operable to effectuate a network of multiple current paths, each having a predetermined current step. A set of relays, remotely controllable by means of switches, control the selection of the applied current path to the coaxial cable interface.

A second fixed transformer is selectably coupled to the output of the variable autotransformer unit via an output relay in a voltage bucking configuration, whereby the second fixed transformer is operable to interface directly with the coaxial cable interface to apply appropriate levels of current for conducting certain additional tests under the GR-1089-CORE standard.

As a further aspect of the present invention, a third fixed transformer is disposed on a separate branch between the first fixed transformer and second load resistor bank via at least one power relay. Accordingly, the third fixed transformer is operable to provide selectably switchable power at a different setting to the second load resistor bank via the separate branch under computer-based timer relay control.

In a still further aspect, the PF apparatus of the present invention includes a resistive interface circuit with a grounded return for interfacing with the line card's T/R interface for conducting certain $1^{st}$ Level AC power fault tests ("Objective Tests") in addition to the $2^{nd}$ Level tests. The resistive interface circuit is controlled through the output relay coupled to the first load resistor bank. A 1:2 step-up transformer with a ground on its secondary coil side is coupled to the output of the output relay for appropriately powering the grounded resistive network.

BRIEF DESCRIPTION OF THE DRAWINGS

A more complete understanding of the present invention may be had by reference to the following Detailed Description when taken in conjunction with the accompanying drawings wherein.

DETAILED DESCRIPTION OF THE DRAWINGS

Figure 1:
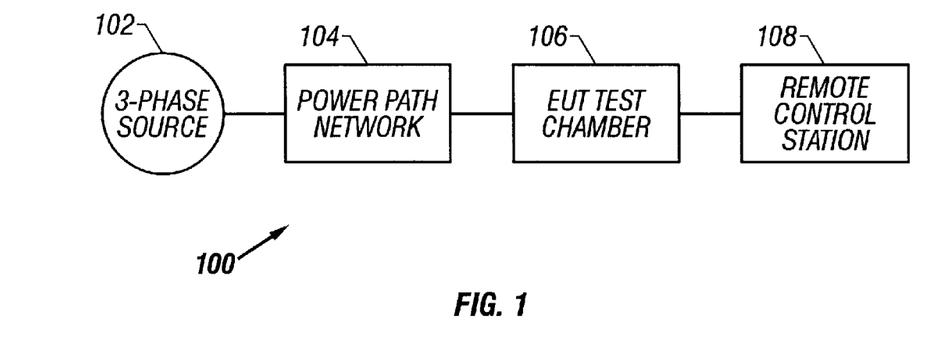
FIG. 1 depicts a functional block diagram of a presently preferred exemplary embodiment of a $2^{nd}$ Level AC power fault machine provided in accordance with the teachings of the present invention for testing T/R and broadband coaxial cable interfaces.

In the drawings, like or similar elements are designated with identical reference numerals throughout the several views thereof, and the various elements depicted are not necessarily drawn to scale. Referring now to FIG. 1, depicted therein is a functional block diagram of a presently preferred exemplary embodiment of an AC power fault (PF) apparatus 100 provided in accordance with the teachings of the present invention for testing telecommunications equipment (EUT), e.g., two-wire T/R interfaces of the line cards and broadband coaxial cable interfaces, to BellCore's AC power fault standards set forth in GR-1089-CORE, Section 4 (Issue 2, Rev. 1), which is incorporated by reference herein. More specifically, the PF apparatus 100 provides an AC power source that is operable in accordance with the electrical conditions specified in Requirements R4-15, 04-17, R4-18, R4-34, R4-36, R4-41, and R4-44, and other parts of GR-1089-CORE relating to the criteria for equipment interfacing with coaxial cable ports (e.g., Section 4.6). Thus, the PF apparatus 100 may hereinafter be referred to as $2^{nd}$ Level PF machine for purposes of the present invention.

In the presently preferred exemplary embodiment of the present invention, the PF machine 100 operates from a three-phase 480 VAC, 600 A shore power service 102 that is commonly available for commercial and industrial installations. As will be set forth in greater detail hereinbelow, the source power is conditioned by a power path network 104 to obtain the required stead-state and transient output power. Essentially, a plurality of power paths are effectuated by a unique combination of transformers and load resistor banks that are interconnected to the three-phase power source 102 in a switchable and selectively actuatable manner so as to generate appropriate levels of current and voltage on each power path that is used for powering the EUT's interface for compliance testing.

Output power from the power path network 104 is provided to the EUT disposed in a test chamber 106, wherein suitable AC power fault disturbances are applied to the EUT's interface with strict time duration control. The test chamber 106 is preferably comprised of a clear Plexiglass enclosure designed to protect test personnel from explosive debris, electrical and fire hazards, and smoke inhalation during the test.

Although not explicitly shown in FIG. 1, it should be appreciated by those skilled in the art that the test chamber 106 may be equipped with an exhaust fan duct to evacuate smoke, etc. Also, a plurality of access holes or apertures may be provided to allow instrumentation probe access, in addition to a set of main doors associated with the test chamber. As will be described below in further detail, the doors are preferably equipped with a safety interlock mechanism actuated at least in part by the position of the doors (i.e., open or closed).

Associated with the test chamber 106 is a remote control station (RCS) 108 which provides test personnel with a station wherein all parameters of the PF apparatus 100 may be remotely monitored and controlled. Preferably, RCS 108 is powered by a external control power source (e.g., 48 VDC), wherein control power is distributed to the various components of the power path network 104 and interlock circuitry.

Figure 2:
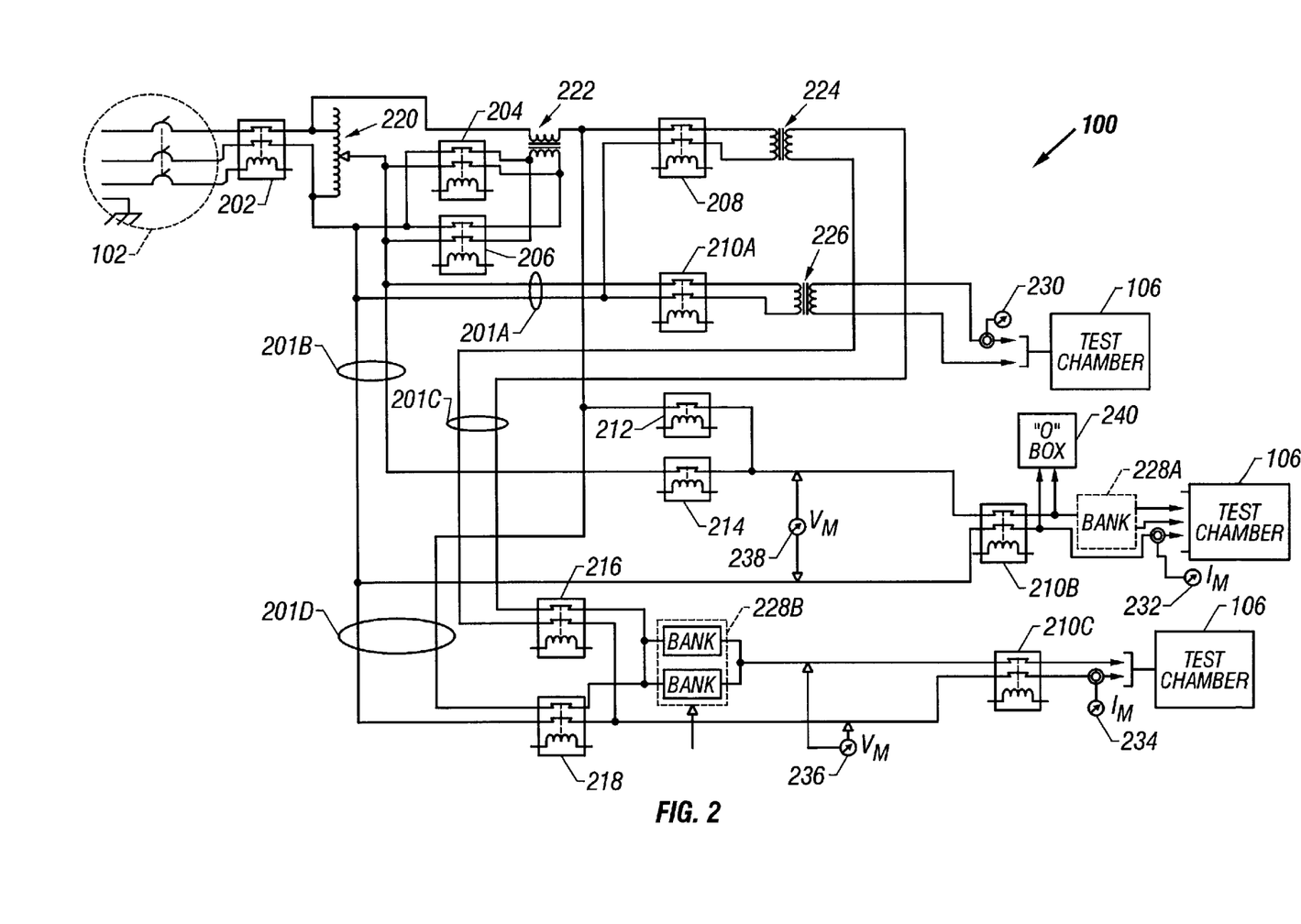
FIG. 2 depicts a schematic diagram of the power fault machine of the present invention.

Referring now to FIG. 2, depicted therein in particular detail is a schematic diagram of the presently preferred exemplary embodiment of the $2^{nd}$ Level PF machine 100 provided in accordance with the teachings of the present invention. As set forth hereinabove, system power provided by the three-phase service 102 is conditioned by a plurality of power paths (e.g., reference numerals 201A, 201B, 201C, and 201D) formed from a combination of transformers and load resistor banks disposed in a selectively switchable network configuration.

Of the three phases available from the power source 102, only two phases are utilized for powering the PF machine 100. It should be readily appreciated that one of the two phases of the power source is operable in the PF machine 100 as a hot neutral or hot return. Since the EUT is isolated in the test chamber 106, a grounded return is not required accordingly. A power relay 202 is provided for selectably coupling the power source 102 to a motor driven, variable autotransformer unit 220 which provides a maximum output of 560 VAC at 120 A. The power output of the variable autotransformer 220 is operable to be selectably coupled to one of the multiple power paths of the PF machine 100 set forth herein. For instance, the power output is selectably switchable to a first load resistor bank 228A via a power relay 214 (disposed on power path 201B) and an output relay 210B which is operable under computer-based timer relay control described in detail hereinbelow. Load resistor bank 228A (also described in detail hereinbelow) interfaces to a two-wire T/R interface of the EUT disposed in the test chamber 106 for effectuating different electrical conditions that are specified under the applicable Requirements for conducting $2^{nd}$ Level AC power fault tests. Accordingly, a voltmeter 238 is provided for monitoring the voltage input across the output relay 210B whereby the output of the variable autotransformer unit 220 can be suitably adjusted. Similarly, an ammeter 232 is coupled to the output of the output relay 210B for monitoring the current applied.

The output of the variable autotransformer 220 is also selectably coupled via a pair of power relays 204, 206 to a first fixed transformer 222 operable in a current boost configuration. Fixed transformer 222 is preferably provided to be a 4:1 step-down transformer which operates in conjunction with the variable autotransformer 220 to provide two levels of output depending on whether relay 204 or relay 206 is asserted. If relay 204 is asserted, the output will be 340–480 V at 480 A (nominal). On the other hand, if relay 206 is asserted, the output will be 480–620 V at 480 A (nominal).

The output of first fixed transformer 222 is selectably switchable to provide power directly to a second load resistor bank 228B that interfaces to a coaxial cable interface via an output relay 210C. Again, computer-based timer relay control is provided for controlling the operation of output relay 210C such that appropriate power may be applied to the EUT for precise and repetitive time durations. The power path 210D from first fixed transformer 222 to load resistor bank 228B is controlled by a power relay 218 disposed thereon.

A second fixed transformer 226 is selectably coupled to the power output of the variable autotransformer unit 220 in a voltage bucking configuration via power path 201A. An output relay 210A operating under computer-based timer relay control actuates the operation of fixed transformer 226 which is preferably provided to be a 20:1 step-down transformer with an output of 24 V at 1000 A. Those skilled in the art should readily appreciate that the power output from the second fixed transformer 226 is particularly suitable for testing the coaxial cable interface for compliance with certain additional criteria set forth in R4-44 wherein a current of 1000 A is to be applied a period of about 20 seconds or so.

Continuing to refer to FIG. 2, a third fixed transformer 224 is disposed on a separate branch (power path 201C) between the first fixed transformer 222 and the second load resistor bank 228B. A selectably activatable power relay 208 couples the first fixed transformer 222 to the third fixed transformer 224, which is preferably provided to be a 1:1.67 step-up transformer operating to provide an output of 1000 V at 350 A. Another power relay, relay 216, selectably switches this power to the second load resistor bank 228B.

As a further aspect of the present invention, the PF machine 100 also includes the capability to conduct certain additional $1^{st}$ Level AC power fault tests specified for two-wire T/R telecom ports in 04-17 of the GR-1089-CORE standard. In order to utilize the power sourced by the PF machine for conducting these tests, a properly grounded interface 240 (labeled as Objective Test Box or "O" Box in this FIG.), which will be described in additional detail hereinbelow, is accordingly provided at the output of timer-controlled output relay 210B disposed on power path 201B in the PF machine of the present invention. Furthermore, a power relay 212 is operable to switch power from the first fixed transformer 222.

Figure 3:
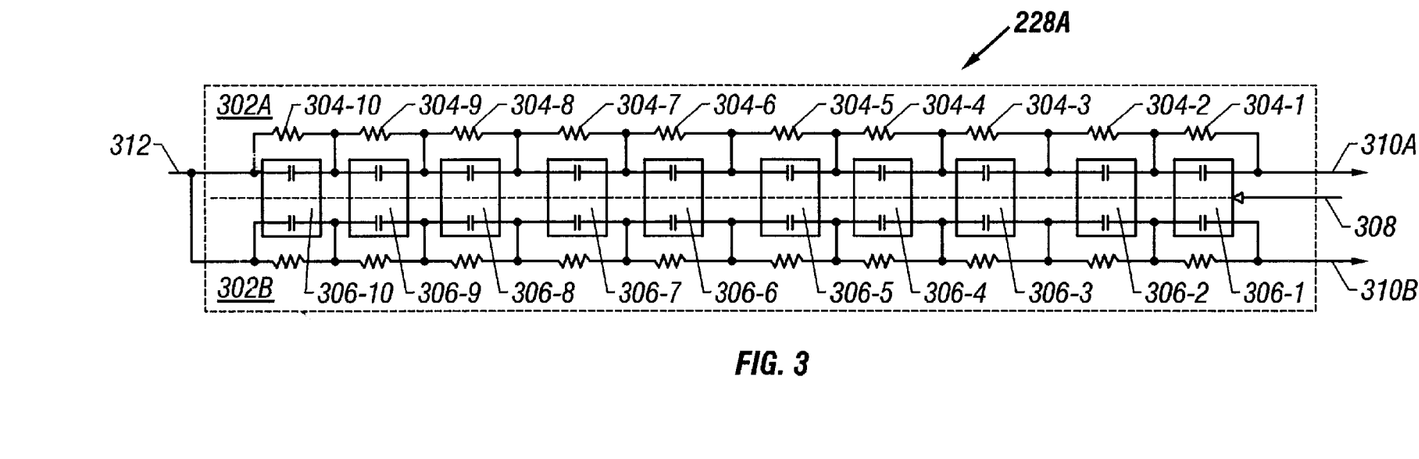
FIG. 3 depicts a schematic diagram of a presently preferred exemplary embodiment of a first load resistor bank for use with the PF machine of the present invention for testing a two-wire T/R interface.

FIG. 3 depicts a schematic diagram of a presently preferred exemplary embodiment of the first load resistor bank 228A for use with the PF machine 100 in testing two-wire T/R interfaces. Power applied via path 312 from the time-controlled output relay 210B is provided to two resistor branches 302A, 302B, wherein each branch is organized as series of resistors whose values are binary-coded. For example, 10 resistors (reference numerals 304-1 through 304-10) are provided for the branch 302A and the resistance values begin with 1 ohm, and double up to a maximum of 512 ohms (i.e., 1, 2, 4, 8, 16, 32, et cetera).

Using the binary coding feature provided in accordance with the teachings of the present invention allows the operator to select 1023 different branch resistance values per branch by employing only 10 individual resistor values. The resistance value selection per branch is controlled by a plurality of relays (reference numerals 306-1 through 306-10) coupled to the resistors in a parallel arrangement. A particular individual resistor becomes active on a branch when a corresponding relay is open (i.e., de-asserted). Accordingly, for example, to obtain an equivalent resistance of 15 ohms on branch 302A or 302B, relays 306-10 through 306-5 are asserted which shunts the corresponding resistors.

In the presently preferred exemplary embodiment of the present invention, the resistor branches of the load resistor bank 226A are provided to be identical. The two branches interface to the two-wire T/R interface via paths 310A and 310B to the EUT disposed in the test chamber. A single control line 308, preferably emanating from the RCS, provides assertion power to the relays 306-1 through 306-10. In an exemplary embodiment, each relay may be equipped with a red indicator lamp which, when illuminated, indicates that the relay is closed (i.e., asserted). The resistor bank 228A is preferably enclosed in a smoke colored Plexiglass case which prohibits contact with, but allows viewing of, resistor bank components. Also, the doors of the case may be equipped with safety interlocks that determine door position. Interlock control logic provided in association with the RCS is operable to disable transformer power (by actuating appropriate power relays) if the resistor bank doors are open.

It should be apparent to one skilled in the art that instead of individual resistors whose values are binary-coded, resistor assemblies may be used in the load resistor bank 228A that have equivalent resistance values in a binary-coded fashion. Numerous resistor arrangements may therefore be had for providing an appropriate resistor bank for purposes of the present invention.

Figure 4:
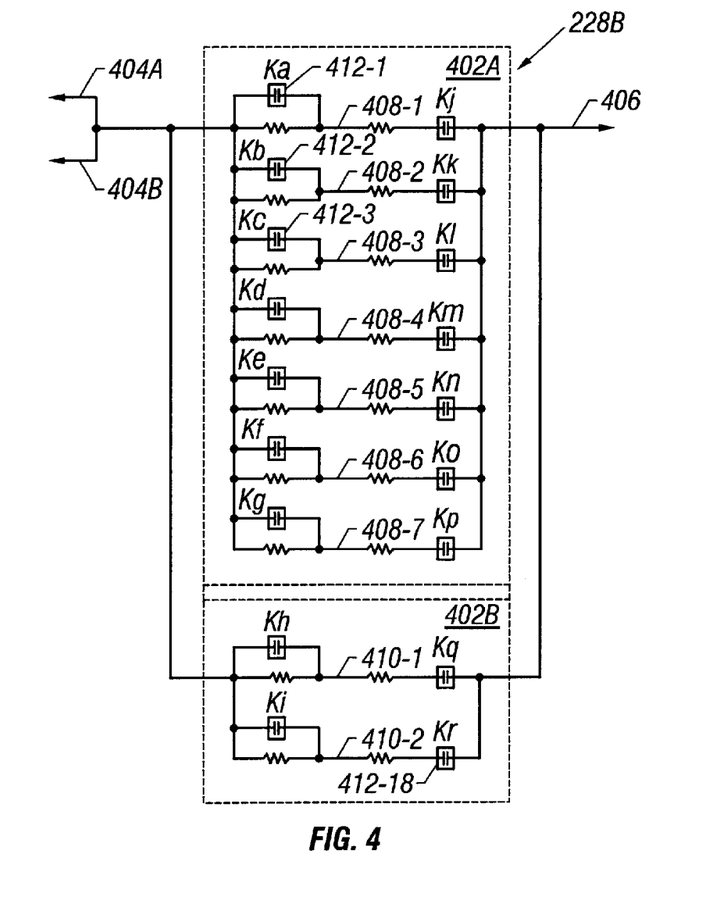
FIG. 4 depicts a schematic diagram of a presently preferred exemplary embodiment of a second load resistor bank for use with the PF machine of the present invention for testing a coaxial cable interface.

Referring now to FIG. 4, depicted therein is a schematic diagram of a presently preferred exemplary embodiment of the second load resistor bank 228B for use with the PF machine 100 of the present invention in testing a coaxial cable interface. Two power path segments 404A and 404B are provided for selectably switchably coupling with the power path network of the PF apparatus by means of power relay 216 (for sourcing 1000 V at 350 A) and power relay 218 (for sourcing 400 V at 350 A), respectively. Coaxial power interface is provided to the EUT through two resistive bank portions 402A and 402B, each comprising a plurality of individual (fixed) power resistors configured to operate as a plurality of current paths having predetermined current steps (e.g., 2 A intervals). Selected output current is provided via path 406 coupled to the timer-controlled output relay 210C in order to apply to the EUT for appropriate time durations (e.g., 3 min., 6 min., et cetera).

The load resistor bank 228B is provided as two segregated resistive bank portions 402A and 402B. Both bank portions comprise one or more current paths, each of which is formed based on one or more load segments comprising a resistor/relay assembly. For example, seven load segments (reference numerals 408-1 through 408-7) are operable to provide a plurality of standard current paths with respect to bank portion 402A. In similar fashion, two load segments 410-1 and 410-2 are exemplified for bank portion 402B for effectuating a plurality of high current paths.

Each power resistor on a path is tapped and a portion of the resistor is switched into or out of the current path, depending on the applied voltage and the required current, by a pair of relays disposed thereon. Accordingly, a total of 18 relays Ka through Kr (reference numerals 412-1 through 412-18) are provided in the exemplary load resistor bank 228B. Assertion control for these relays is provided through a plurality of switches preferably provided as part of the RCS of the PF machine.

Figure 5:
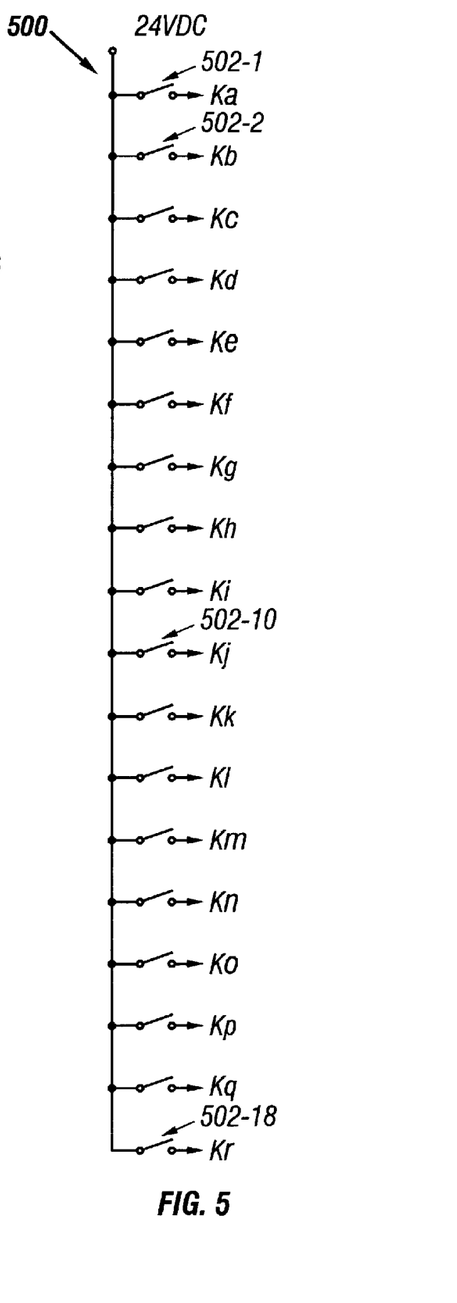
FIG. 5 depicts an exemplary switch arrangement for controlling the relays used in the second load resistor bank.

FIG. 5 depicts an exemplary switch arrangement 500 for controlling the relays used in the second load resistor bank 228B. Eighteen switches, reference numerals 502-1 through 502-18, operable by means of control power (24 VDC) are available at the RCS for selective activation thereof, which asserts the corresponding relays in the load resistor bank and effectuates a resultant current path therethrough. For example, by closing switches 502-1 and 502-10, relays Ka and Kj are asserted, thereby effectuating a current path that results from the equivalent resistance of the load segment 408-1.

Figure 6:
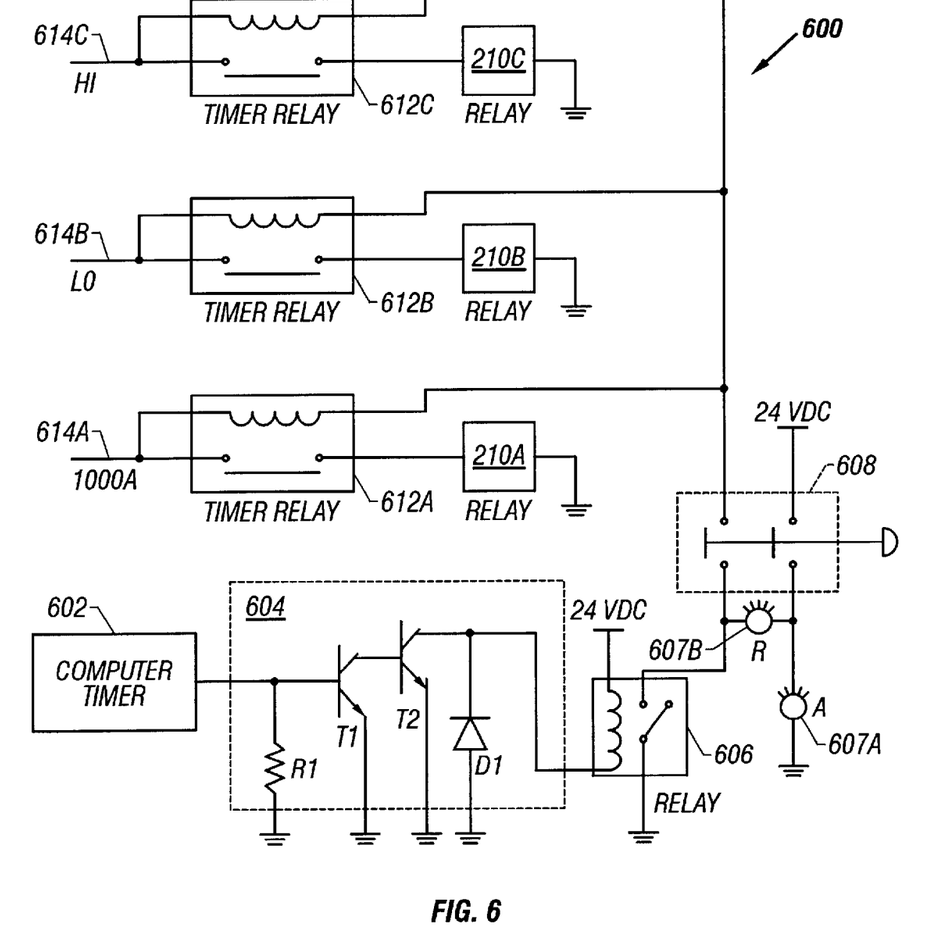
FIG. 6 depicts a schematic diagram of a presently preferred exemplary embodiment of a computer-controlled timer arrangement for controlling output relays used for load switching in the PF machine of the present invention.

Referring now to FIG. 6, depicted therein is a schematic diagram of a presently preferred exemplary embodiment of a computer-controlled timer arrangement 600 for controlling the output relays used in the PF machine of the present invention. A computer-based timer 602 is operable to control three timer relays 612A through 612C that provide assertion control to the selected one of the output relays 210A through 210C which switch power to the EUT. Power to each timer relay is selected by a particular switch combination (described hereinbelow with reference to the interlocking/switch mechanism depicted in FIG. 8) which powers one of the paths 614A, 614B or 614C. In the presently preferred exemplary embodiment of the present invention, only one timer relay may be powered at any time. A pull(ON)/push (OFF) switch 608 operates to enable timer output relay 606 that is interfaced via appropriate interface electronic circuitry 604 to the computer-based timer 602. Preferably, the interface circuitry comprises power transistors (e.g., T1 and T2), diodes (e.g., D1), resistors (e.g., R1) and the like.

When the timer output relay 606 is enabled, a selected timer relay is asserted, which in turn controls the selected output relay. Upon activating the switch 608, an amber lamp 607A is illuminated. A red lamp 607B is illuminated when the selected output relay is asserted for providing appropriate AC power to the corresponding load.

Figure 7:
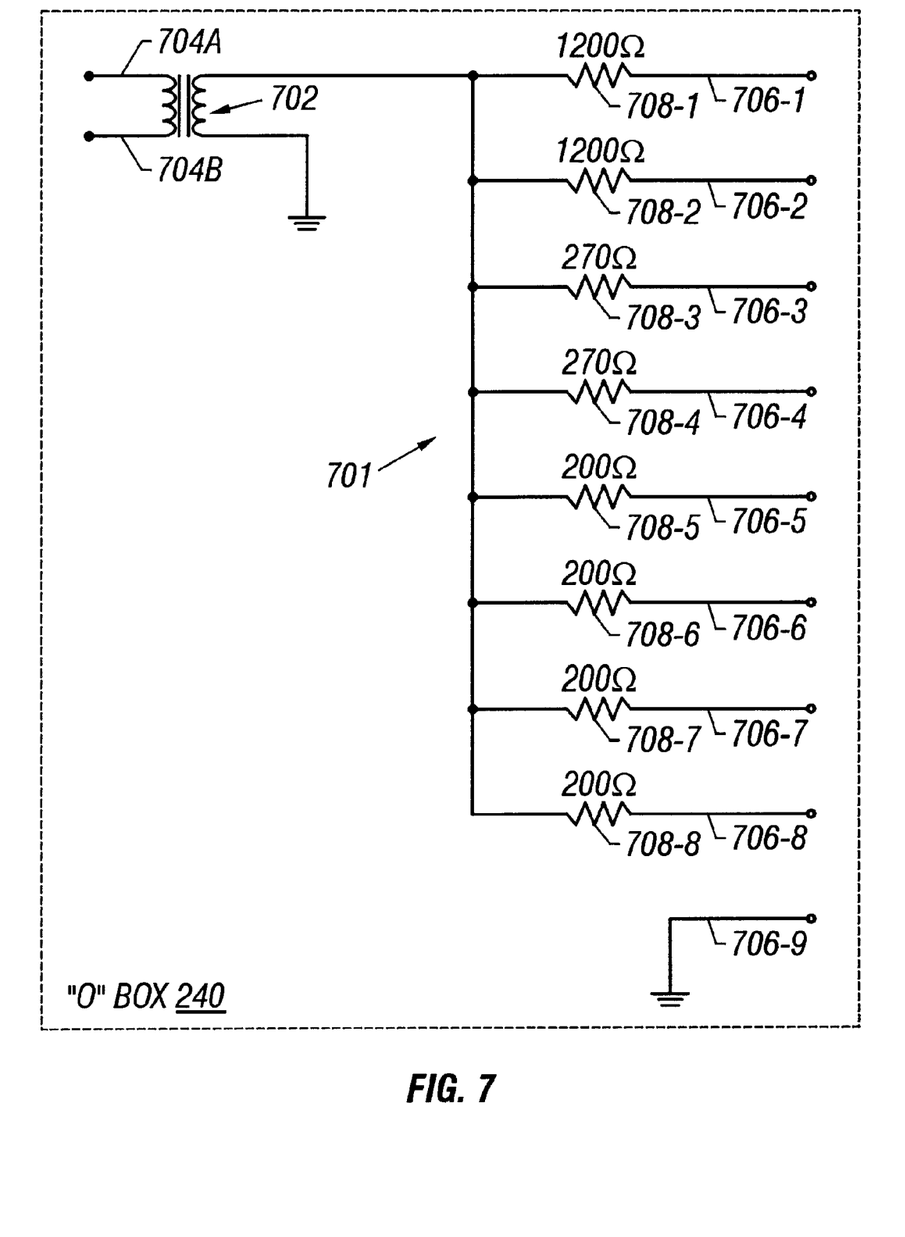
FIG. 7 depicts a schematic diagram of a presently preferred exemplary embodiment of a grounded "Objective Test" interface circuit for use with the PF machine of the present invention for conducting certain $1^{st}$ Level AC power fault tests.

FIG. 7 depicts a schematic diagram of a presently preferred exemplary embodiment of a grounded resistive interface circuit 240 (labeled as "O" Box) for use with the PF machine of the present invention for conducting certain $1^{st}$ Level AC power fault tests set forth in GR-1089-CORE. As pointed out earlier in reference to the description of FIG. 2 hereinabove, "O" Box 240 is coupled to the output relay 210B for providing appropriately grounded power to the EUT, i.e., line card operating (under power) in a standard line card rack, for performing the Objective tests. Essentially, "O" Box 240 allows a return path to be common with rack ground even though test power is sourced by the hot return power of the PF machine 100.

A 1:2 transformer 702 is provided in the "O" Box interface circuit 240 wherein primary coil leads 704A and 704B are coupled to the output relay 210B. A common grounded return is effectuated on the secondary coil side that is coupled to a resistive network 701 comprising a plurality of resistive branches (reference numerals 706-1 through 706-8) in addition to a grounded lead 706-9. A selected value of resistance is provided on each resistive branch of the network 701. In the exemplary embodiment shown in FIG. 7, resistors 708-1 through 708-8 exemplify the selected resistance values employed in the resistive network 701 of the present invention.

Test power is switchably applied to the EUT by controlling the output relay 210B operating under computer-based timer relay control described in detail hereinabove. Appropriate means (switches, relays, and the like) may be provided for selecting a particular resistive branch for interfacing to the line card. Also, "banana" jacks coupled to cables may be provided for tapping into the desired resistive source of the "O" box interface circuit 240.

Figure 8:
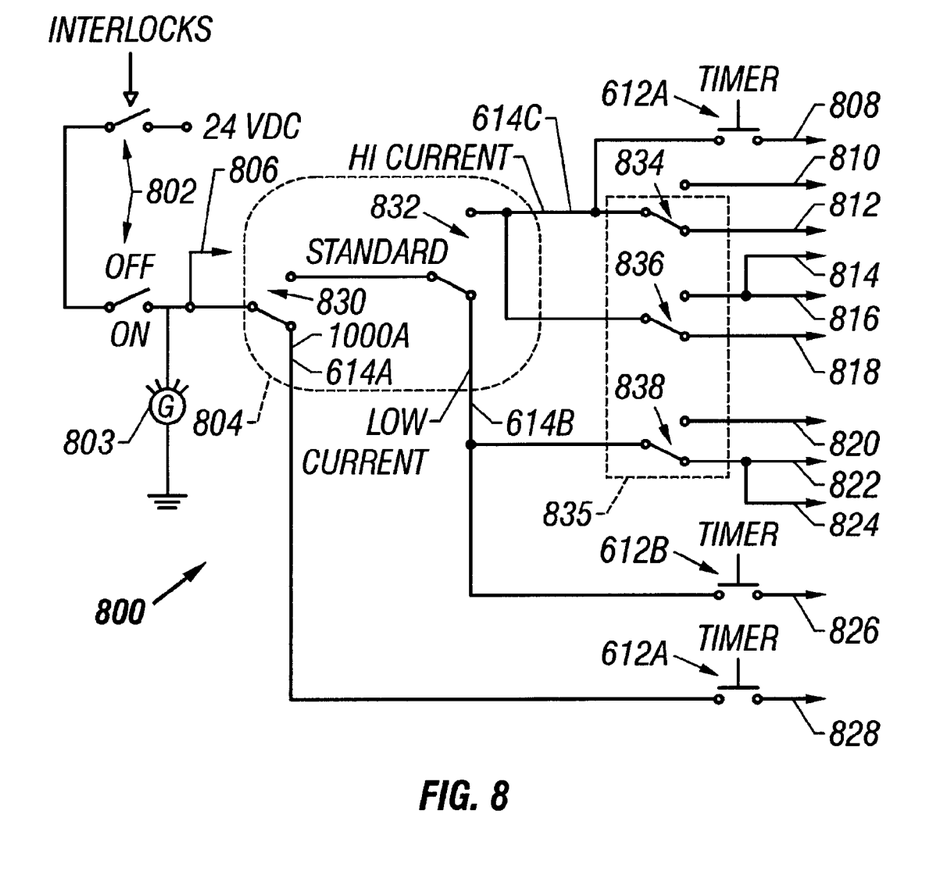
FIG. 8 depicts an exemplary interlock/switch arrangement for use with the PF machine of the present invention.

Referring now to FIG. 8, depicted therein is an exemplary interlock/switch arrangement 800 for use with the PF machine 100. As alluded to hereinabove, the RCS incorporates interlock/switch circuitry to prevent unsafe application of source power to the load resistor banks and EUT test chamber. In the presently preferred exemplary embodiment of the RCS control logic, the doors of both fixtures must be securely closed in order to activate the interlocks 802. One or more green lamps (e.g., lamp 803) may be utilized to indicate compliance with the RCS control logic.

Upon activating the interlocks 802, control power is applied for asserting power relay 202 via path 806, which couples the variable autotransformer to the AC power source. To enable distribution of control power to the remaining components, i.e., transformers and assorted relays, a switch arrangement 804 comprising a pair of switches 830 and 832 is utilized to select between the 1000 A path 614A, standard low current path 614B, and standard high current path 614A, each of which is selectively activatable under computer-based timer relay control as described above. Upon asserting appropriate timer relay, assertion power to output relays is provided via paths 808, 826, and 828 (for asserting output relays 210C, 210B, or 210A, respectively). A commonly-tied switch bank 835 comprising switches 834, 836, and 836 controls the assertion of the various power relays (relays not used for load switching) for effectuating only allowable combination(s) of the power paths in the power path network of the PF machine 100. By appropriately configuring the switches and the relays, a single throw may be effectuated to properly assert the relays such that shorts, etc. in the power path network are avoided.

Continuing to refer to FIG. 8, paths 810 and 812 provide assertion power to relays 206 and 204, respectively, disposed between the variable autotransformer unit 220 and fixed transformer 222. Paths 814, 816 and 818 provide assertion power to relays 216, 218 and 208 for effectuating transmission of coaxial cable interface power. Similarly, paths 820, 822 and 824 provide assertion power to relays 214, 212 and 206 for effectuating transmission of T/R two-wire interface power.

Based upon the foregoing Detailed Description, it should be readily apparent that the present invention provides an innovative AC power source solution that complies with the existing standards for $2^{nd}$ Level power fault testing of telecom equipment without the shortcomings and deficiencies of the conventional AC power fault machines set forth in the Background section of the present patent application. The versatile design of the PF machine provided in accordance with the teachings of the present invention is advantageously capable of sourcing power to both two-wire interfaces as well as broadband cable interfaces within one platform. By connecting a current boost transformer to the output of a variable autotransformer, source current is increased by a factor of 4, thereby allowing the current ranges required under the applicable BellCore standards for performing $2^{nd}$ Level AC disturbance tests. It should be appreciated that by using the current boosting technique, a much smaller autotransformer can be used in the PF machine's design, thereby saving cost and reducing overall size. Additionally, by including over-current transformers (e.g., first and third fixed transformers), an over-current condition of 125% for about 3 minutes may be achieved in order to comply with certain requirements in the same machine.

Furthermore, the present invention allows the use of the same or substantially the same components for a variety of tasks. For instance, by utilizing the binary coding feature of the present invention, a small number of resistor values may be advantageously assembled to provide a large number of branch resistance values for providing a significant range of test power. Also, individual components can be selectively optimized based on their function within the PF machine. For example, the various relays used for effectuating the selectably switchable power paths can be comprised of an assortment of available relays. Relays not used for load switching are designed to make and conduct, but not break, load current at the specified voltage level (i.e., lower cost components). Relays used to interconnect transformers and relays used to control the load are specified to make, conduct, and break load current. Accordingly, by utilizing a mixture of off-the-shelf and custom designed components to meet the necessary full-range AC requirements, overall form factor as well as manufacturablity can be advantageously optimized.

Further, it is believed that the operation and construction of the present invention will be apparent from the foregoing Detailed Description. While the apparatus shown and described has been characterized as being preferred, it should be readily understood that various changes and modifications could be made therein without departing from the scope of the present invention as set forth in the following claims.

What is claimed is:

1. A power fault testing apparatus for testing telecommunications interfaces, comprising:
   a variable autotransformer unit coupled to a three-phase power source through a power relay, said variable autotransformer unit operating to provide a power output selectably switchable to a first load resistor bank, wherein said first load resistor bank interfaces to a tip-and-ring interface of an equipment under test (EUT) operable to be disposed in a test chamber;
   a first fixed transformer selectably coupled to said power output of said variable autotransformer unit in a current boost configuration, said first fixed transformer operating to provide selectably switchable power at a first level to a second load resistor bank, wherein said second load resistor bank interfaces to a coaxial cable interface of an EUT operable to be disposed in said test chamber; and
   a second fixed transformer selectably coupled to said power output of said variable autotransformer unit in a voltage bucking configuration, said second fixed transformer interfacing to said coaxial cable interface to apply a selected power thereto.

2. The power fault testing apparatus for testing telecommunications interfaces as set forth in claim 1, further comprising a third fixed transformer disposed on a separate branch between said first fixed transformer and said second load resistor bank, said third fixed transformer operating to provide selectably switchable power at a second level to said second load resistor bank via said separate branch.

3. The power fault testing apparatus for testing telecommunications interfaces as set forth in claim 2, wherein said third fixed transformer comprises a 1:1.67 step-up transformer.

4. The power fault testing apparatus for testing telecommunications interfaces as set forth in claim 2, further comprising a pair of relays disposed between said variable autotransformer unit and said first fixed transformer.

5. The power fault testing apparatus for testing telecommunications interfaces as set forth in claim 4, further comprising at least one relay disposed between said variable autotransformer unit and said first load resistor bank.

6. The power fault testing apparatus for testing telecommunications interfaces as set forth in claim 5, wherein said at least one relay comprises an output relay operable under computer-based timer relay control.

7. The power fault testing apparatus for testing telecommunications interfaces as set forth in claim 6, wherein said first fixed transformer comprises a 4:1 step down transformer and is operable to provide selectably switchable power to said first load resistor bank.

8. The power fault testing apparatus for testing telecommunications interfaces as set forth in claim 7, wherein said first load resistor bank comprises a plurality of binary-coded resistors selectable by a series of relays coupled thereto.

9. The power fault testing apparatus for testing telecommunications interfaces as set forth in claim 7, wherein a resistive interface circuit with a grounded return is coupled to said output relay via a 1:2 step-up transformer.

10. The power fault testing apparatus for testing telecommunications interfaces as set forth in claim 4, wherein an output relay is disposed between said variable autotransformer unit and said second fixed transformer, said output relay selectably operating under computer-based timer relay control.

11. The power fault testing apparatus for testing telecommunications interfaces as set forth in claim 10, wherein said second fixed transformer comprises a 20:1 step down transformer.

12. The power fault testing apparatus for testing telecommunications interfaces as set forth in claim 4, further comprising:
   at least one relay disposed between said first fixed transformer and said second load resistor bank; and
   an output relay disposed between said second load resistor bank and said coaxial cable interface, said output relay selectably operating under computer-based timer relay control.

13. The power fault testing apparatus for testing telecommunications interfaces as set forth in claim 12, wherein said second load resistor bank is comprised of a plurality of resistor segments operable to effectuate one or more current paths with a predetermined current step per path, and further wherein individual resistors disposed on said resistor segments are selectively activatable by a plurality of relays coupled thereto.

14. The power fault testing apparatus for testing telecommunications interfaces as set forth in claim 13, wherein said plurality of relays are operable by a combination of manual switches.

15. A power fault testing apparatus for testing telecommunications interfaces, comprising:
   a three-phase 480 VAC, 600 A power service for sourcing power to said power fault testing apparatus;
   a plurality of transformers and load resistor banks selectably and switchably coupled to said power service in a network organized as a plurality of power paths for interfacing to one of a tip-and-ring interface and a broadband coaxial cable interface of an equipment under test (EUT);
   a plurality of power relays for interconnecting said transformers and said load resistor banks disposed in said network; and
   a plurality of output relays for effectuating duration control of output power applied to said tip-and-ring and broadband coaxial cable interfaces.

16. The power fault testing apparatus for testing telecommunications interfaces as set forth in claim 15, wherein said plurality of output relays are controlled by a computer-based timer relay control mechanism.

17. The power fault testing apparatus for testing telecommunications interfaces as set forth in claim 16, wherein said EUT is placed in a testing chamber comprised of a clear Plexiglass enclosure.

18. The power fault testing apparatus for testing telecommunications interfaces as set forth in claim 17, wherein said testing chamber is provided with a safety interlocking mechanism.

19. The power fault testing apparatus for testing telecommunications interfaces as set forth in claim 17, further including a remote control station associated with said test chamber.

20. The power fault testing apparatus for testing telecommunications interfaces as set forth in claim 17, wherein said plurality of load resistor banks comprises a binary-coded resistor bank.

21. The power fault testing apparatus for testing telecommunications interfaces as set forth in claim 17, wherein said plurality of load resistor banks comprises a power resistor bank operable to effectuate one or more current paths with a predetermined current step per path.

* * * * *